United States Patent [19]

Horigome

[11] Patent Number: 5,722,060
[45] Date of Patent: Feb. 24, 1998

[54] RADIO RECEIVER

[75] Inventor: Fumihiko Horigome, Saitama-ken, Japan

[73] Assignee: Pioneer Electronic Corporation, Tokyo, Japan

[21] Appl. No.: 642,492

[22] Filed: May 3, 1996

[30] Foreign Application Priority Data

May 11, 1995 [JP] Japan ................................ 7-113327

[51] Int. Cl.$^6$ .................................................. H04B 1/12
[52] U.S. Cl. .......................................... 455/234.1; 455/254
[58] Field of Search .............................. 455/234.1, 246.1, 455/295, 303, 304, 306, 249.1, 254.1, 254

[56] References Cited

U.S. PATENT DOCUMENTS

| | | |
|---|---|---|
| 5,321,851 | 6/1994 | Sugayama et al. .............. 455/246.1 |
| 5,390,345 | 2/1995 | Wada et al. ...................... 455/234.1 |
| 5,483,694 | 1/1996 | Bartels et al. ...................... 455/295 |

FOREIGN PATENT DOCUMENTS

| | | |
|---|---|---|
| 34 47 284 | 12/1984 | Germany . |
| 40 00 899 | 1/1990 | Germany . |
| 42 41 362 | 12/1992 | Germany . |

Primary Examiner—Amelia Au
Attorney, Agent, or Firm—Nikaido, Marmelstein, Murray & Oram LLP

[57] ABSTRACT

A radio receiver has an antenna circuit, a high-frequency amplifier, a tuned circuit, a mixer for generating a first intermediate frequency signal, and an AGC circuit applied with an output signal of the radio receiver for controlling a gain of the receiver. An intermodulation predicting circuit is provided. The intermodulation predicting circuit has a high-frequency amplifier applied with an output of the radio receiver, and a mixer for generating a second intermediate frequency signal. The intermodulation predicting circuit has a dynamic range smaller than that of the radio receiver. Therefore an intermodulation prediction signal based on a received broadcasting signal is produced earlier than a response to the received broadcasting signal at the radio receiver.

5 Claims, 7 Drawing Sheets

80MHz   90MHz   100MHz   110MHz   F
$2f_1-f_2$   $f_1$   $f_2$   $2f_2-f_1$

RADIO RECEIVER

BACKGROUND OF THE INVENTION

The present invention relates to a radio receiver, and more particularly to an automatic gain control (AGC) thereof which is controlled when intermodulation interference may occur.

The FM radio broadcast is enjoyed by many because of its high sound quality. However, due to the increase in the number of the broadcast stations, a desired broadcast signal is often interfered by undesired signals from other broadcast stations, so that the sound quality is deteriorated.

One of these interferences is an intermodulation interference caused by nonlinear amplifier and mixer provided in the radio receiver. When two or more interference signals are intermodulated, there occurs a spectrum at a frequency different from those of the interference signals, thereby causing a phenomenon as if a broadcast signal exists at the frequency. The frequency of the spectrum and the frequency of the desired broadcast signal generate beats thereby generating unpleasant sounds. In extreme cases, it becomes impossible to hear the desired broadcast.

There has been proposed an AGC wherein a gain of an antenna circuit or an RF amplifier is reduced when the intermodulation signals exist in a received broadcast signal. However, the gain is reduced even though the level of the interference signal is not high enough to cause actual interference. Hence the sensitivity of the receiver to the desired station is excessively restrained.

Japanese Patent Publication 63-12407 discloses a system where such a problem is solved. In the system, the level of the input broadcast wave is detected and a plurality of intermodulation interference detecting signals are generated in accordance with the detected level. When it is detected that there exists a broadcast wave which may interfere with the desired broadcast wave dependent on the intermodulation interference signal detecting signals, the gain of the AGC is controlled. However, the system must be provided with detectors and control units for controlling the gain, which causes the system to be complicated.

SUMMARY OF THE INVENTION

An object of the present invention is to provide a radio receiver of a simple construction where intermodulation interference can be restrained without causing deterioration in sensitivity to the desired broadcast wave.

According to the present invention, there is provided a radio receiver having an antenna circuit, a first high-frequency amplifier, a tuned circuit, a mixer for generating a first intermediate frequency signal, and an AGC circuit applied with an output signal of the radio receiver for controlling a gain of the receiver, comprising, an intermodulation predicting circuit having a second high-frequency amplifier applied with an output of the radio receiver, and a mixer for generating a second intermediate frequency signal, and having a dynamic range smaller than that of the radio receiver, so that an intermodulation prediction signal based on a received broadcasting signal is produced earlier than a response to the received broadcasting signal at the radio receiver.

These and other objects and features of the present invention will become more apparent from the following detailed description with reference to the accompanying drawings.

DETAILED DESCRIPTION OF THE PREFERRED EMBODIMENT

Figure 1:
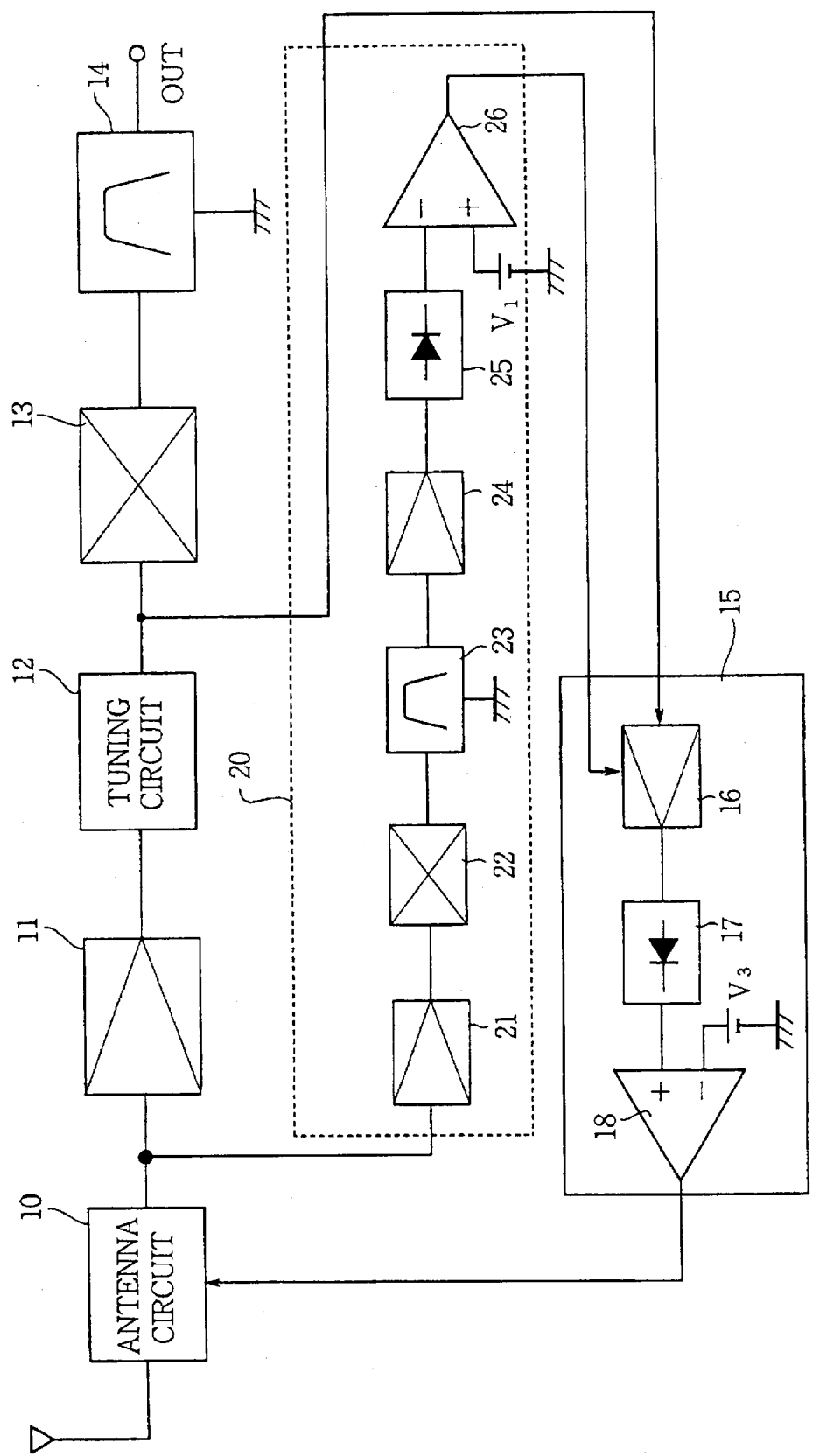
FIG. 1 is a block diagram of a radio receiver according to the present invention.

Referring to FIG. 1. in an FM radio receiver according to the present invention, a broadcast signal is fed to an antenna circuit 10 including a tuned circuit. An output signal of the antenna circuit 10 is applied to a high-frequency amplifier 11. The amplified broadcast signal is tuned in to a frequency of a desired broadcast station at a tuned circuit 12 so that the desired broadcast signal is obtained. The desired broadcast signal is fed to a mixer 13 so as to be mixed with a locally generated signal from a local oscillator (not shown) and passed through a ceramic filter 14, thereby generating an intermediate frequency signal at a frequency f0 of 10.7 MHz.

The output signal of the tuned circuit 12 including the desired broadcast signal and may be including two interference signals, the frequencies of which are f1 and f2, is applied to an AGC circuit 15 which controls the gain of the antenna circuit 10. The output signal from the tuned circuit 12 is amplified by a high-frequency amplifier 16 to a predetermined level and detected by a detector 17. The output of the detector 17 is applied to the non-inverting input terminal of a comparator 18. The inverting input terminal of the comparator 18 is applied with a reference voltage V3. When the voltage of the ouptut signal of the detector 17 exceeds the voltage V3, the comparator 18 produces a control signal which is fed to the antenna circuit 10, thereby to control the gain thereof. The gain is thus controlled in accordance with the input level of the desired broadcast signal so that the signal-to-noise ratio is prevented from deteriorating.

The radio receiver of the present invention is provided with an intermodulation predicting circuit 20 for predicting the occurrence of intermodulation signal at a time when the level of which is not yet high enough to cause actual intermodulation interference in the broadcast signal. The intermodulation predicting circuit 20 has a high-frequency amplifier 21 which the output signal of the antenna circuit 10 is fed to and amplified by. The amplified signal is fed to a mixer 22. The amplified signal is mixed with a local signal from a local oscillator (not shown) at the mixer 22 and applied to an amplifier 24 through a ceramic filter 23 as an intermediate frequency signal of the frequency f0 of 10.7 MHz.

The intermediate frequency signal from the ceramic filter 23 is amplified by the amplifier 24 to a predetermined level, and fed to a detector 25. The detector 25 detects the level of the amplified signal which is fed to a comparator 26 wherein the level is compared with a reference voltage V1. When the level of the output signal of the detector 25 is higher than the voltage V1, the comparator applies a gain control signal of a low level to a control input of the AGC circuit 15.

Hereinafter, the intermodulation (hereinafter called IM) interference is described. In the FM radio broadcast, the tertiary IM causes interference of the receiving. The secondary IM frequencies may be expressed as f2−f1or f1+f2, and the tertiary IM frequencies which may cause the IM interference may be expressed as 2f1−f2or 2f2−f1.

Figure 3:
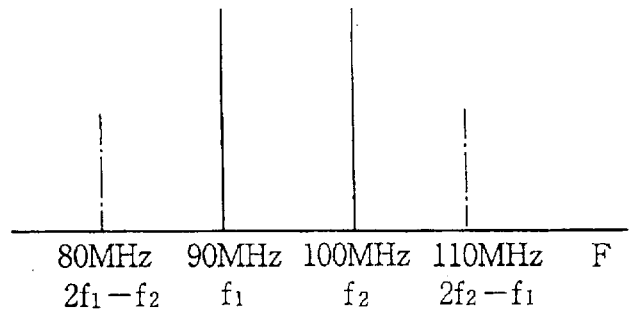
FIGS. 3a to 3c show levels of received signals.
Figure 3:
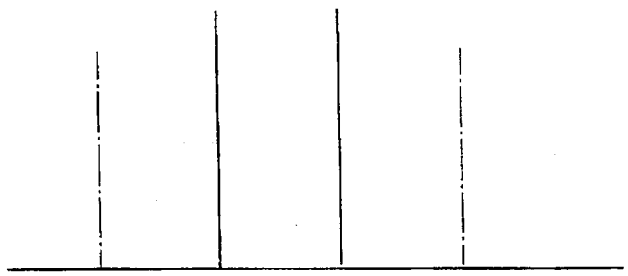
Figure 3:
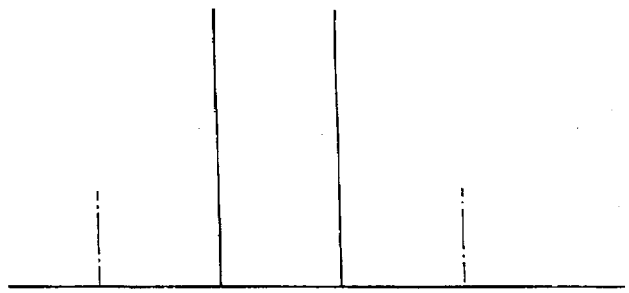

FIG. 3a shows levels of signals of the IM frequency signals. If the desired frequency is tuned at 80 MHz, the broadcast signal is interfered with the IM frequency signals.

If the dynamic range of the mixer 22 or amplifier 24 is small, large output are produced at frequencies 80 and 110 MHz causing the IMs as shown in FIG. 3b. If the dynamic range is large, small outputs are produced as shown in FIG. 3c. FIGS. 3a to 3c are illustrated in a way that the signals are not intermediate frequencies.

Figure 4:
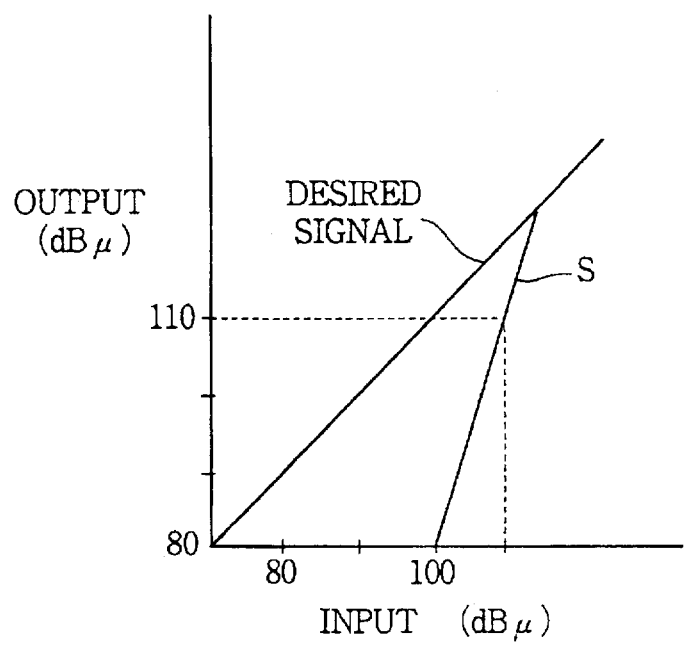
FIGS. 4 and 5 are graphs showing relationships between the antenna input levels and levels of output signal of filters of FIG. 1.
Figure 5:
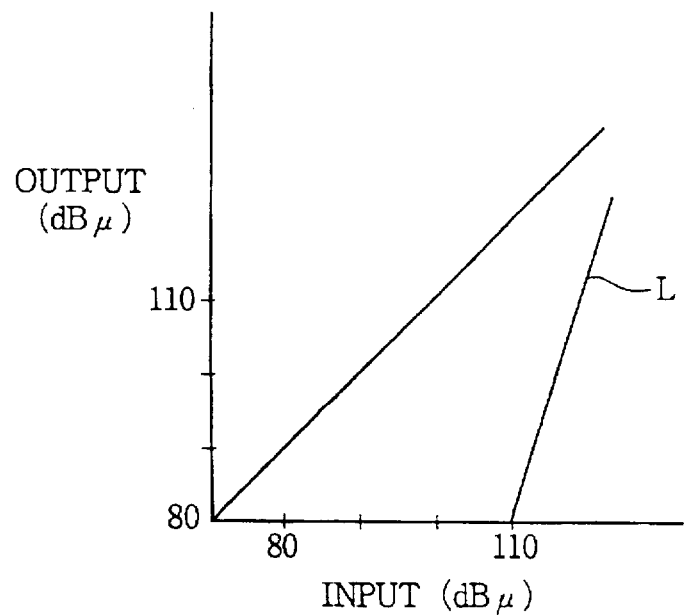

A line S of FIG. 4 shows the relationship between the input signal level of the antenna circuit 10 and the level of the output signal of the filter 23, when the dynamic range is set to a small value, and a line L of FIG. 5 shows the relationship when the dynamic range is large.

In FIG. 4, when the input is 100 dB, the output is 110 dB as shown by dotted line. On the other hand, in FIG. 5, when the input is 100 dB (the same as FIG. 4), the output is 80 dB. In other words, when the output is 80 dB at the large dynamic range circuit, the output of the small dynamic range circuit is 110 dB. There is a 30 dB difference between the both circuits. Namely if the dynamic range is set to a small value, an output having the same level of the large dynamic range is generated earlier than the output of the large dynamic range circuit.

Therefore the dynamic range of the IM predicting circuit 20 is set to a smaller value than that of the amplifier 11 of the FM radio circuit. Namely, the IM interference can be detected before the actual IM interference occurs in the FM radio circuit.

Figure 2:
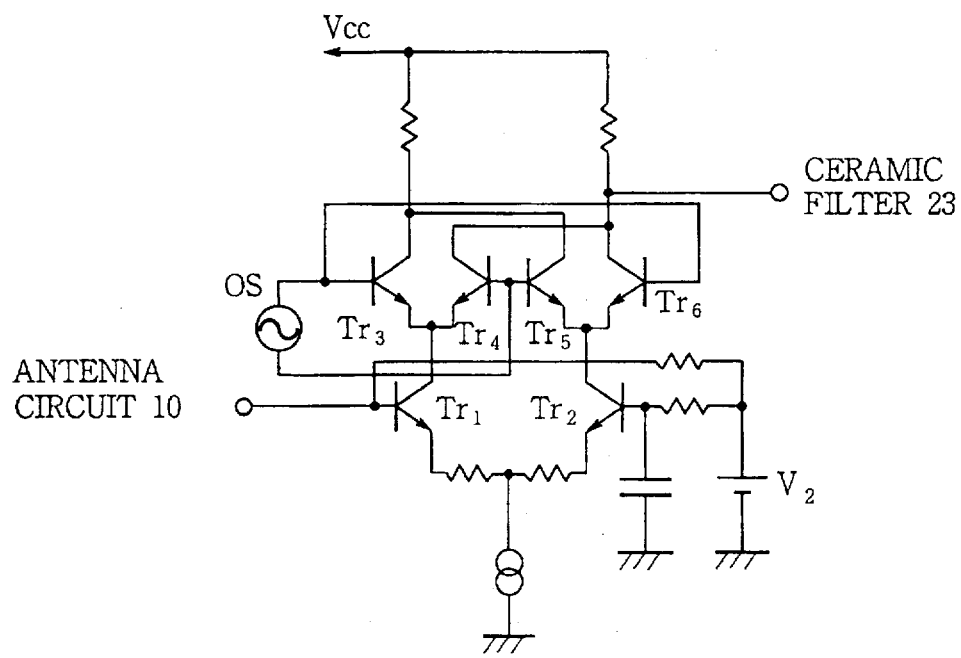
FIG. 2a shows a detailed circuitry of a high-frequency amplifier in an intermodulation predicting circuit provided in the radio receiver of FIG. 1.
FIG. 2b shows an AGC circuit provided in the radio receiver of FIG. 1 in detail.
Figure 2:
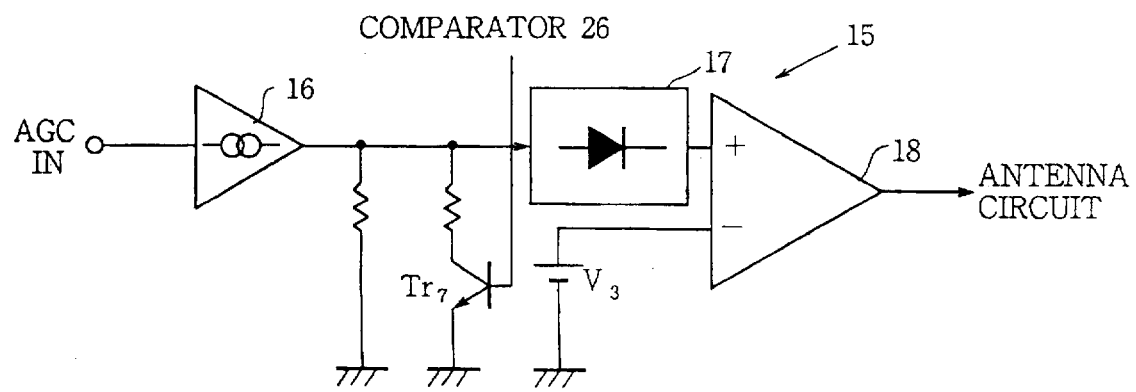

Referring to FIG. 2a, the actual circuitry of the high-frequency amplifier 21 and the mixer 22 of the IM predicting circuit 20 comprises transistors Tr1 to Tr6 and an oscillator Os as the local oscillator. The bases of the transistors Tr1 and Tr2 are applied with the output signal of the antenna circuit 10. The base of the transistor Tr2 is further applied with a reference voltage V2. The bases of the transistors Tr3 to Tr6 are fed with the local signal from the oscillator Os. Hence, an output amplified in accordance with the output voltage of the antenna circuit 10 is produced at the collectors of the transistors Tr4 and Tr6. The output signal is fed to the mixer 22 in FIG. 1.

Referring to FIG. 2b, the AGC circuit 15 is provided with a transistor Tr7, the base of which is applied with the gain control signal from the comparator 26 of the IM predicting circuit 20. When the low level gain control signal is fed, the transistor Tr7 is rendered non-conductive so that the gain of the amplifier 16, that is the output is increased. In other words, the gain of the AGC is changed. Thus, the comparator 18 produces a high level output signal which is applied to an output resistor (not shown) of the antenna circuit so as to reduce the output of the antenna circuit.

The operation of the radio receiver of the present invention is described hereinafter. The radio receiver is tuned to receive a desired FM broadcast signal of 80 MHz, for example.

The FM broadcast signal is supplied by the antenna circuit 10 and amplified at the amplifier 11. The broadcast signal is fed to the tuned circuit 12 so that the desired signal of 80 MHz is selected. The desired broadcast signal is mixed with the locally generated signal of 69.3 MHz so that the intermediate frequency signal of the intermediate frequency f0 of 10.7 MHz is produced at the output of the ceramic filter 14.

The output signal of the tuned circuit 12 is applied to the high-frequency amplifier 16 of the AGC circuit 15. The signal is amplified and fed to the detector 17. The level of the signal is compared with the reference voltage V3 at the comparator 18 which applies the output signal to the antenna circuit 10. When the level is higher than the voltage V3, the output of the antenna circuit 10 is reduced, that is the gain of the antenna circuit is reduced. Thus, the gain at the antenna circuit 10 is controlled to a constant value.

The output signal of the antenna circuit including the desired broadcast signal of 80 MHz and the interference signals are applied to the IM predicting circuit 20. The signal is amplified at the high-frequency amplifier 21 and mixed with the locally generated signal of 69.3 MHz at the mixer 22 so that the intermediate frequency signal at the intermediate frequency f0 of 10.7 MHz is produced and fed through the ceramic filter 23 to the amplifier 24.

The output of the amplifier 24 is applied to the detector 25. The level of the output signal of the detector 25 is compared with the voltage V1 at the comparator 26. When the level is lower than the reference voltage V1, the comparator produces a high level control signal. This means that the the level of the interference signal is so small that the actual intermodulation is unlikely to occur in the amplifier 11 and the mixer 13 of the main passage. The high level control signal is fed to the base of the transistor Tr7 of the AGC circuit 15 to render the transistor conductive, thereby reducing the output of the amplifier 16. Therefore, the comparator 18 produces a low level signal which is applied to the antenna circuit 10, so that the output of the antenna circuit is not reduced. Thus, the ordinary level output is produced from the FM radio circuit.

When the interference signal is mixed with the broadcasting signal, the level of the mixed signal applied to the comparator increases. When the level of the signal increases higher than the reference voltage V1, the comparator 26 produces the the low level output. This means that the actual intermodulation interference may occur. As described above, the low level output causes the transistor Tr7 to be cut off, so that the comparator produces the high level output. Thus the output of the antenna circuit is lowered. Thus, the occurrence of the intermodulation signal is prevented.

The present invention may be modified to apply the broadcast signal to the IM predicting circuit 20 from the front-end or the rear-end of the mixer 13 instead of from the rear-end of the antenna circuit 10.

Figure 6:
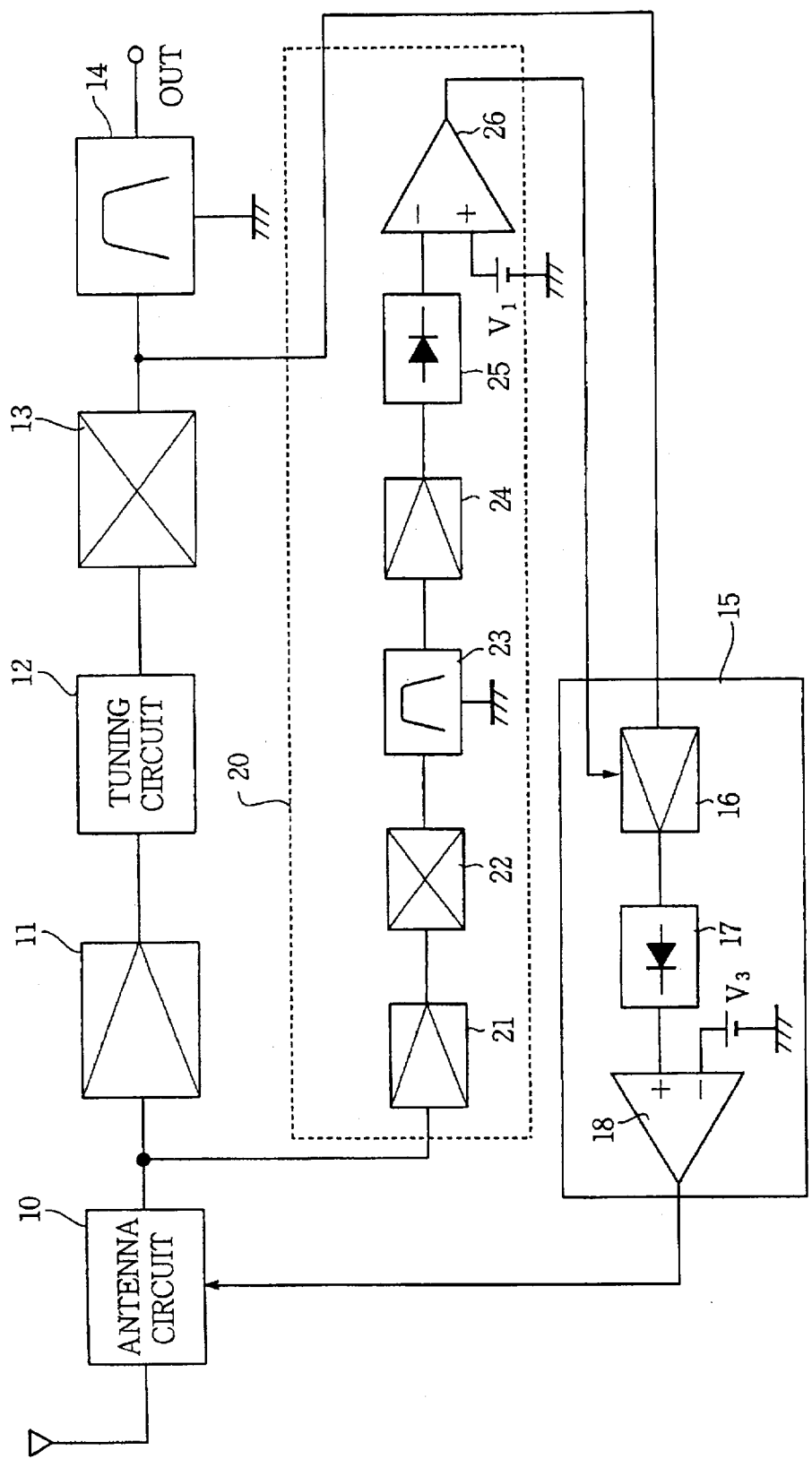
FIG. 6 is a block diagram showing a modification of the radio receiver of FIG. 1.

Furthermore, as shown in FIG. 6, the output signal of the mixer 13 may be applied to the AGC circuit 15 instead the output signal of the tuned circuit 12. Thus, the operation of the AGC is executed based on the intermediate frequency signal.

The present invention may also be applied to an AM radio receiver wherein the intermodulation interference is caused by secondary intermodulation signals, the frequencies of which are expressed as f2−f1 and f1+f2. The levels of the secondary intermodulation signals are detected to control the operation of the AGC circuit 15.

Figure 7:
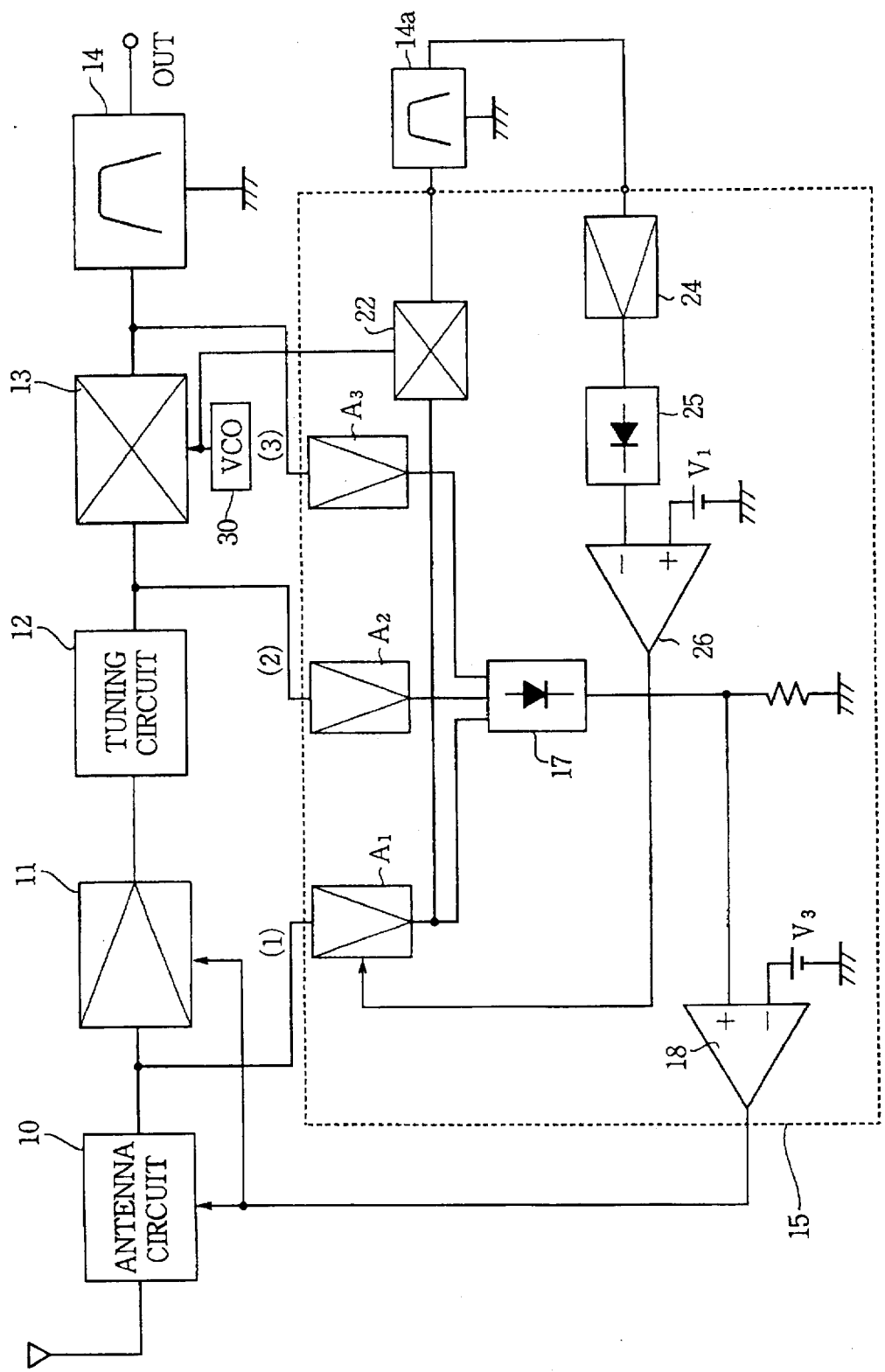
FIG. 7 is a block diagram showing a second embodiment of the radio receiver of the present invention.

FIG. 7 shows a second embodiment of the present invention. The radio receiver is provided with the antenna circuit 10, high-frequency amplifier 11, tuned circuit 12, mixer 13 and the ceramic filter 14 as the main passage of the broadcast signal as in the first embodiment. The mixer 13 is applied with a local signal from a VCO 30 to produce the intermediate frequency signal. The IM predicting circuit 20 of FIG. 1 is included in the AGC circuit 15. The AGC circuit comprises three amplifiers A1, A2 and A3, to which signals (1), (2) and (3) from the antenna circuit 10, tuned circuit 12 and the mixer 13 are fed, respectively. The levels of the signals (1) and (3), or the signals (2) and (3) are selected for operating the normal AGC. Namely, the detector 17 adds the levels of the amplified signals (1) and (2) or the signals (2) and (3) in accordance with the OR logic so that the RF signal is detected. The detected RF signal is applied to the comparator 18 wherein the level thereof is compared with the reference voltage V3. When the level of the RF signal becomes higher than the voltage V3, a high level output signal is fed to the antenna circuit 10 so that the level of output signal of the antenna circuit is reduced.

In order to detect a low level interference signal, the output signal (1) from the antenna circuit 10 is amplified by the amplifier A1 and fed to the mixer 22 to which the local signal from the VCO 30 is fed. Hence a signal at the intermediate frequency f0 is generated at a ceramic filter 14a. The intermediate frequency signal is amplified by the amplifier 24 and fed to the detector 25 wherein the intermodulation prediction signal is extracted. The level of the intermodulation prediction signal is compared with the reference voltage V1 at the comparator 26 which feeds the gain control signal to the amplifier A1 when the level of the intermodulation signal is lower. Accordingly, the gain of the amplifier A1 is reduced so that the level of the signal fed to the comparator 18 is decreased. As a result, the AGC is not reduced when the level of the intermodulation prediction signal is small.

Figure 8:
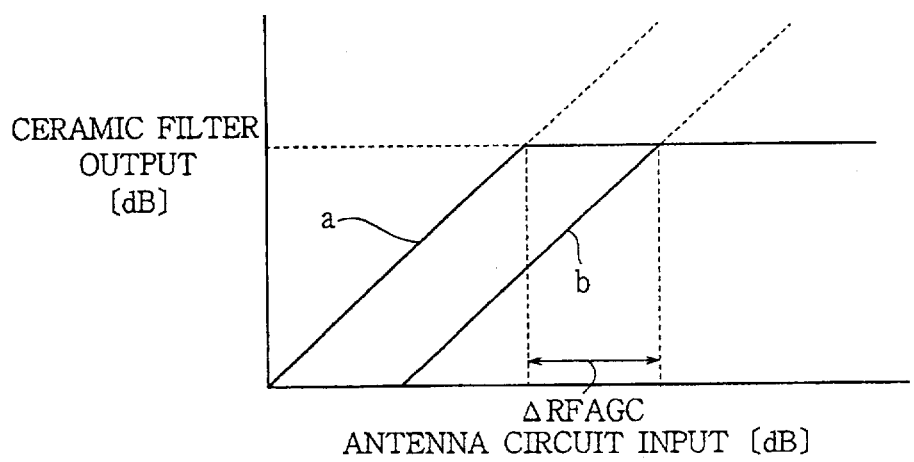
FIG. 8 is a graph showing relationships between antenna circuit input levels and ceramic filter output levels during a normal operation and a decreased gain operation in an AGC circuit provided in the radio receiver of FIG. 7.

Namely, as shown in FIG. 8, compared to a normal AGC shown by a line a, the AGC of the present embodiment shown by a line b is retarded a period corresponding to the gain ΔRFAGC when the level of the intermodulation prediction signal is so low as not to cause interference.

The embodiment shown in FIG. 7 may be modified to control the gain of the amplifier A2 instead of the amplifier A1.

Although the gain of the amplifier A1 is controlled, to DC gain of the detector 17 may be controlled.

Figure 9:
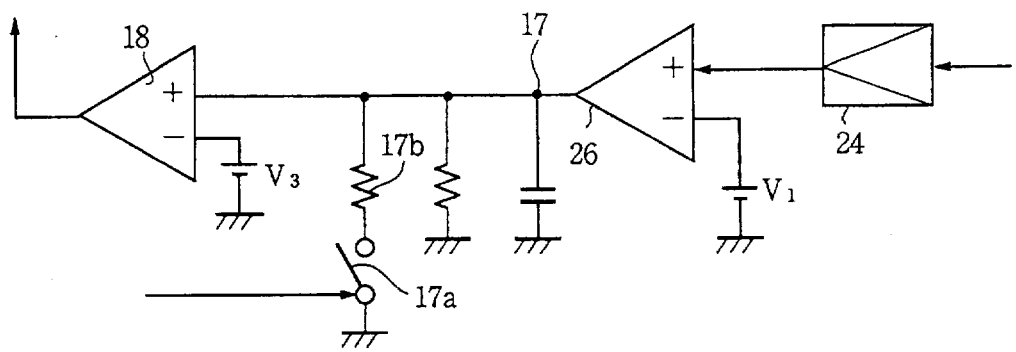
FIG. 9 is a circuitry showing a detector provided in a third embodiment of the present invention.

For example, as shown in FIG. 9, the detector 17 is provided with a resistor 17b and a switch 17a which is closed when the output signal of the comparator 26 is high.

Thus, a high level control signal is applied to the antenna circuit 10 from a comparator 18.

Figure 10:
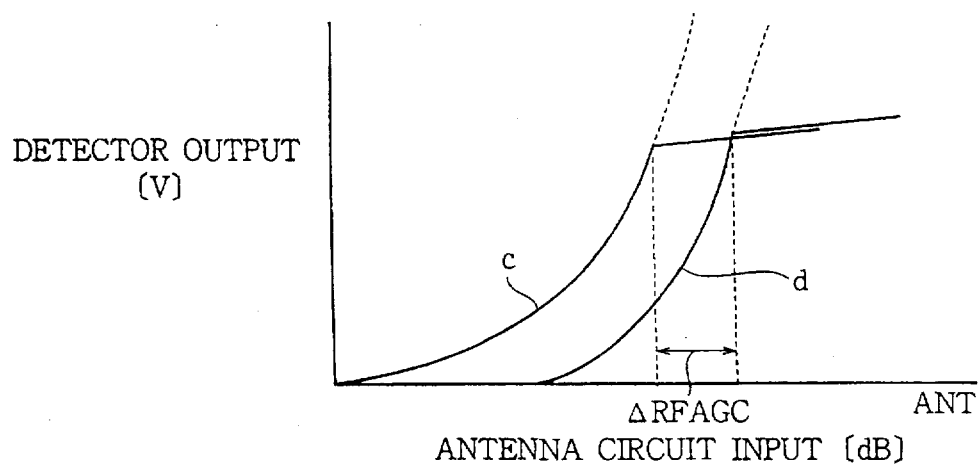
FIG. 10 is a graph showing relationships between antenna circuit input levels and output levels of the detector of FIG. 9 during a normal operation and a decreased gain operation of the AGC circuit.

Referring to FIG. 10, a line c shows the output of the detector 17 when the DC gain is increased, and a line d shows the output when the DC gain is decreased. The AGC is retarded a period corresponding to the gain ΔRFAGC when the DC gain is reduced.

In accordance with the present invention, the level of the output of the input circuit is kept at a normal value when the level of the intermodulation prediction signal is small enough so as not to cause interference. The sensitivity of the radio receiver to the desired broadcast signal is hence retained. When the level of the interference signal is increased so that the interference may occur, the AGC is operated so that the intermodulation interference is sufficiently restrained. The herein described operation of the radio receiver can be carried out with a system of a simple construction.

While the invention has been described in conjunction with preferred specific embodiment thereof, it will be understood that this description is intended to illustrate and not limit the scope of the invention, which is defined by the following claims.

What is claimed is:

1. A radio receiver having an antenna circuit, a first high-frequency amplifier, a tuned circuit, a mixer for generating a first intermediate frequency signal, and an AGC circuit applied with an output signal of the radio receiver for controlling a gain of the receiver, comprising:

an intermodulation predicting circuit having a second high-frequency amplifier applied with an output of the radio receiver, and a mixer for generating a second intermediate frequency signal, and having a dynamic range smaller than that of the radio receiver, so that an intermodulation prediction signal based on a received broadcasting signal is produced earlier than a response to the received broadcasting signal at the radio receiver.

2. The radio receiver according to claim 1 wherein the intermodulation predicting circuit has a comparator to produce the intermodulation predicting signal when an output signal of the second high-frequency amplifier is higher than a reference value.

3. The radio receiver according to claim 2 wherein the AGC circuit is arranged to be operated by the intermodulation predicting signal for reducing the gain of the radio receiver.

4. The radio receiver according to claim 3 wherein the AGC circuit is arranged such that a gain of the AGC circuit is changed by the intermodulation predicting signal.

5. The radio receiver according to claim 3 wherein the gain of the radio receiver is a gain of the antenna circuit.

* * * * *